United States Patent
Yu et al.

(10) Patent No.: US 9,923,044 B2
(45) Date of Patent: Mar. 20, 2018

(54) PACKAGING SUBSTRATE, DISPLAY PANEL AND CURVED-SURFACE DISPLAY PANEL

(71) Applicant: BOE TECHNOLOGY GROUP CO., LTD., Beijing (CN)

(72) Inventors: Donghui Yu, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 14/912,352

(22) PCT Filed: Jul. 24, 2015

(86) PCT No.: PCT/CN2015/085014
§ 371 (c)(1),
(2) Date: Feb. 16, 2016

(87) PCT Pub. No.: WO2016/145759
PCT Pub. Date: Sep. 22, 2016

(65) Prior Publication Data
US 2017/0040410 A1 Feb. 9, 2017

(30) Foreign Application Priority Data

Mar. 17, 2015 (CN) .......................... 2015 1 0117148

(51) Int. Cl.
*H01L 27/32* (2006.01)
*H01L 51/00* (2006.01)
*H01L 51/52* (2006.01)

(52) U.S. Cl.
CPC ...... *H01L 27/3293* (2013.01); *H01L 51/0097* (2013.01); *H01L 51/524* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2004/0185195 A1* | 9/2004 | Anderson | ......... B32B 17/10036 428/34 |
| 2008/0224949 A1 | 9/2008 | Lee et al. | |
| 2015/0016126 A1* | 1/2015 | Hirakata | ............... F21V 15/012 362/418 |

FOREIGN PATENT DOCUMENTS

| | | |
|---|---|---|
| CN | 1622726 A | 6/2005 |
| CN | 101290445 A | 10/2008 |
| CN | 201284989 Y | 8/2009 |
| CN | 101540160 A | 9/2009 |

(Continued)

OTHER PUBLICATIONS

First Office Action regarding Chinese application No. 201510117148.8, dated Dec. 10, 2015. Translation provided by Dragon Intellectual Property Law Firm.

(Continued)

*Primary Examiner* — Michelle Mandala
(74) *Attorney, Agent, or Firm* — Harness, Dickey & Pierce, P.L.C.

(57) ABSTRACT

The present disclosure relates to the field of display technology, and provides a packaging substrate, a display panel and a curved-surface display panel. The packaging substrate includes a base which has a plurality of splice blocks, and the adjacent splice blocks are concatenated to each other by an adhesive material.

20 Claims, 4 Drawing Sheets

(56) References Cited

FOREIGN PATENT DOCUMENTS

| | | |
|---|---|---|
| CN | 101886778 A | 11/2010 |
| CN | 102013222 A | 4/2011 |
| CN | 202736422 U | 2/2013 |
| CN | 103515410 A | 1/2014 |
| CN | 104733503 A | 6/2015 |

OTHER PUBLICATIONS

International Search Report and Written Opinion dated Dec. 17, 2015 regarding PCT/CN2015/085014. Translation provided by Dragon Intellectual Property Law Firm.

Third Office Action regarding Chinese application No. 201510117148.8, dated Aug. 10, 2016. Translation provided by Dragon Intellectual Property Law Firm.

* cited by examiner

PACKAGING SUBSTRATE, DISPLAY PANEL AND CURVED-SURFACE DISPLAY PANEL

CROSS REFERENCE OF RELATED APPLICATIONS

This application is the U.S. national phase of PCT Application No. PCT/CN2015/085014 filed on Jul. 24, 2015, which claims a priority of the Chinese patent application No. 201510117148.8 filed on Mar. 17, 2015, the disclosures of both of which are incorporated herein by reference.

TECHNICAL FIELD

The present disclosure relates to the field of display technology, and in particular to a packaging substrate, a display panel and a curved-surface display panel.

BACKGROUND

An Organic Light-Emitting Diode (OLED) display device is quite unique in the field of flexible display. As compared with a flat panel display device, a curved-surface OLED display device may provide a wider viewing angle and a broader panoramic viewing effect, so curved-surface television (TV) has currently been a representative of high-end TVs.

The curved-surface OLED display device generally includes a packaging substrate and a base substrate. During the manufacture, the packaging substrate is aligned with and adhered to the base substrate through an adhesive, and then the adhesive is cured. Then, an external force is applied onto edges of the resultant substrate to bend it, thereby to obtain the curved-surface OLED display device.

Usually, for the packaging substrate, ultra thin glass, i.e., glass having a thickness of less than 50 μm, is adopted as a base. However, the flexibility of such ultra thin glass is insufficient. When the resultant substrate is bent, cracks will easily occur at the packaging substrate and the packaging substrate will easily be broken.

SUMMARY

An object of the present disclosure is to provide a packaging substrate, a display panel and a curved-surface display panel, so as to prevent the occurrence of cracks, thereby to prevent the packaging substrate from being broken during the formation of the curved-surface display panel.

In one aspect, the present disclosure provides in some embodiments a packaging substrate including a base having a plurality of splice blocks. The adjacent splice blocks are concatenated to each other by an adhesive material.

In another aspect, the present disclosure provides in some embodiments a display panel for a curved-surface display device. The display panel includes a base substrate having an organic light-emitting functional layer, and the above-mentioned packaging substrate.

In yet another aspect, the present disclosure provides in some embodiments a curved-surface display panel formed by bending the above-mentioned display panel.

According to the embodiments of the present disclosure, the packaging substrate includes the base having a plurality of splice blocks, and the adjacent splice blocks are concatenated to each other by an adhesive material. During the process of bending the display panel including the above-mentioned packaging substrate to form the curved-surface display panel, when an external force is applied to edges of the display panel, the packaging substrate is deformed. At this time, deformation energy of the packaging substrate may be dispersed to the plurality of splice blocks which are independent from each other, and it is merely necessary for each splice block to absorb a small quantity of deformation energy. As a result, it is able to effectively prevent the occurrence of cracks at the packaging substrate during the formation of the curved-surface display panel by bending the display panel, thereby to prevent the packaging substrate from being broken.

BRIEF DESCRIPTION OF THE DRAWINGS

In order to illustrate the technical solutions of the present disclosure or the related art in a clearer manner, the drawings desired for the embodiments or the related art will be described briefly hereinafter. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

The present disclosure provides in some embodiments a packaging substrate including a base having a plurality of splice blocks, and the adjacent splice blocks are concatenated to each other by an adhesive material.

It should be appreciated that, shapes, sizes, quantities, and arrangement modes of the splice blocks are not particularly defined herein. For facilitating the manufacture, the splice blocks may be of an identical shape and an identical size. In addition, although the above-mentioned packaging substrate is primarily applied to a curved-surface display device, it may also be applied to any other flat-panel display devices, which is not particularly defined herein.

According to the embodiments of the present disclosure, the packaging substrate includes the base having a plurality of splice blocks, and the adjacent splice blocks are concatenated to each other by an adhesive material. During the process of bending the display panel including the above-mentioned packaging substrate to form the curved-surface display panel, when an external force is applied to edges of the display panel, the packaging substrate is deformed. At this time, deformation energy of the packaging substrate may be dispersed to the plurality of splice blocks which are independent from each other, and it is merely necessary for each splice block to absorb a small quantity of deformation energy. As a result, it is able to effectively prevent the occurrence of cracks at the packaging substrate during the formation of the curved-surface display panel by bending the display panel, thereby to prevent the packaging substrate from being broken.

Alternatively, each splice block may be made of glass or a metal foil, so as to facilitate the manufacture of the curved-surface display device.

Furthermore, each splice block may be made of glass which has a thickness of less than or equal to 500 μm. It should be appreciated that, when there are a large number of splice blocks, the conventional glass which has a thickness of 200 μm, 300 μm, 400 μm or 500 μm may be adopted, so as to enable the display panel to be bent at a relatively small arc and reduce the cost. Of course, each splice block may also be made of ultra thin glass which has a thickness of less than or equal to 50 μm. Due to the well flexibility of the ultra thin glass, it is able to bend the display panel at a relatively large arc under the effect of an external force.

Figure 1:
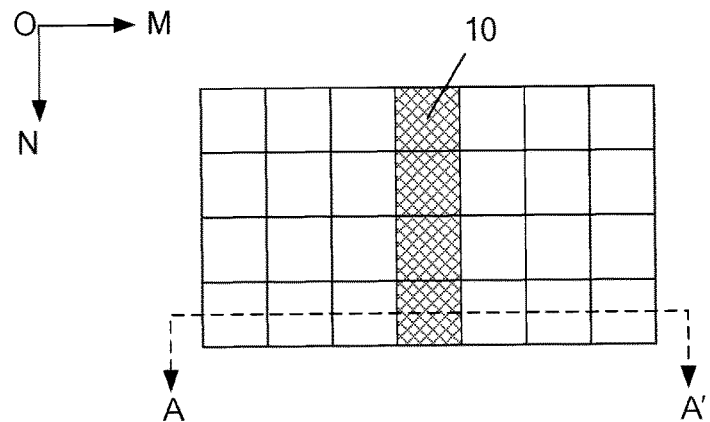
FIG. 1 is a schematic view showing a packaging substrate according to one embodiment of the present disclosure.
Figure 2:
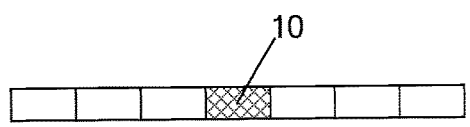
FIG. 2 is a sectional view of the packaging substrate in FIG. 1 along line AA'.

Alternatively, as shown in FIGS. 1-2, the splice blocks are of an identical shape and arranged in at least one row in a direction shown by line OM. The splice blocks in each row include a first splice block 10, and the other splice blocks are symmetrically arranged in a row relative to the first splice block 10. Of course, the splice blocks may also be arranged in at least one row in a direction shown by line ON. The following description is given by taking the splice blocks arranged in at least one row along the direction shown by OM as an example.

Figure 3:
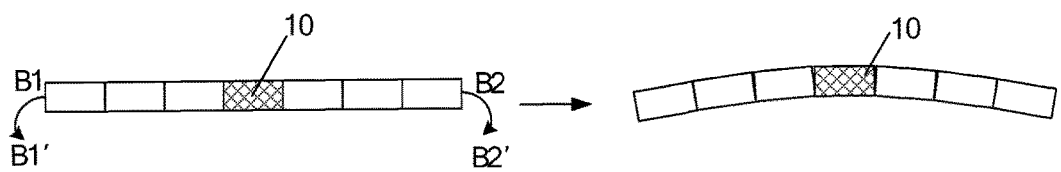
FIG. 3 is a schematic view showing a bending process of the packaging substrate according to one embodiment of the present disclosure.
Figure 4:
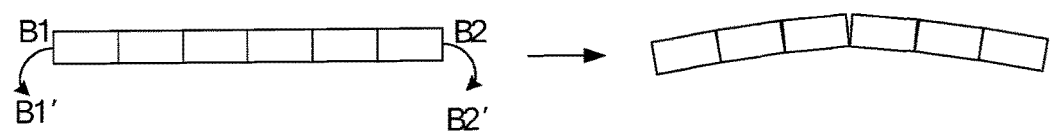
FIG. 4 is another schematic view showing the bending process of the packaging substrate according to one embodiment of the present disclosure.

In this way, on one hand, when the splice blocks are of an identical shape, it is able to facilitate the manufacture of the packaging substrate. On the other hand, as shown in FIG. 3, when the external force is applied to the two edges of the packaging substrate, two sides of the packaging substrate may be bent along directions B1B1' and B2B2' respectively. Since the other splice blocks are arranged symmetrically in a row relative to the first splice block 10, the first splicer blocks 10 are located at a top portion of a curved surface of the curved packaging substrate, as to prevent the situation in FIG. 4 where a gap occurs at the top portion of the curved surface and between the adjacent splice blocks. In addition, the deformation energy generated at the top portion of the curved surface of the packaging substrate may be dispersed to the first splice blocks, so as to further enhance the crack resistance at the top portion of the curved surface.

Figure 5:
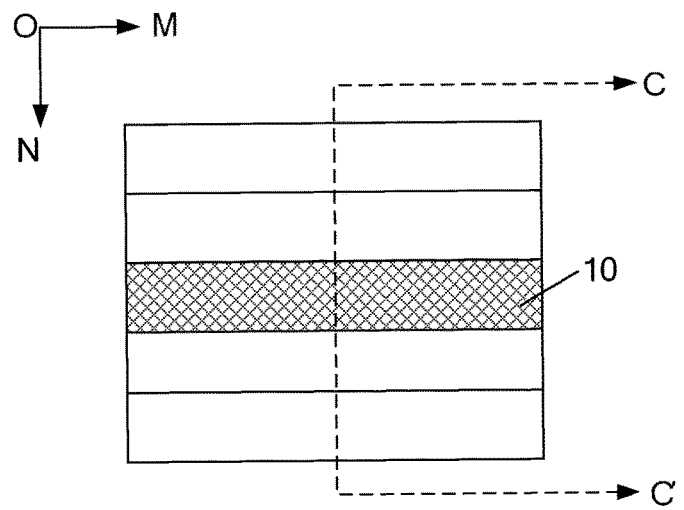
FIG. 5 is yet another schematic view showing the packaging substrate according to one embodiment of the present disclosure.
Figure 6:
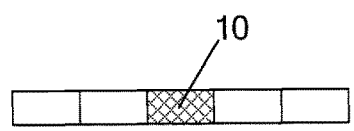
FIG. 6 is a sectional view of the packaging substrate in FIG. 5 along line CC'.
Figure 7:
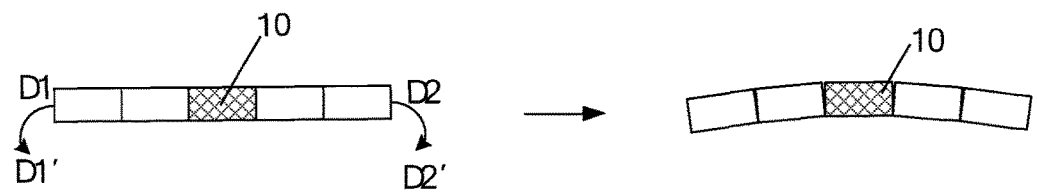
FIG. 7 is yet another schematic view showing the bending process of the packaging substrate according to one embodiment of the present disclosure.

Alternatively, as shown in FIGS. 5-6, the packaging substrate includes first splice blocks 10. All the splice blocks are of an identical shape, an odd number of splice blocks are arranged in each row in the direction shown by ON, and the other splice blocks in each row are arranged symmetrically relative to the first block 10. Of course, the other splice blocks may also be arranged in a row in the direction shown by OM. As shown in FIG. 7, when the external force is applied to the two edges of the packaging substrate, two sides of the packaging substrate may be bent along directions of D1D1' and D2D2' respectively. Since the other splice blocks in each row are arranged in a row symmetrically relative to the first splice block 10, the first splice blocks 10 are located at the top portion of the curved surface of the curved packaging substrate, so as to prevent the situation where a gap occurs at the top portion of the curved surface and between the adjacent splice blocks. As a result, it is able to further enhance the crack resistance at the top portion of the curved surface.

Figure 8:
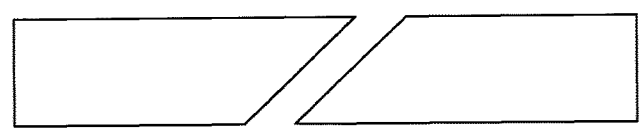
FIG. 8 is a schematic view showing adjacent splice blocks with a sloping splice surfaces in the packaging substrate according to one embodiment of the present disclosure.

Furthermore, as shown in FIGS. 8-11, the two adjacent splice blocks include splice surfaces fitting each other, i.e., the splice surfaces of the two adjacent splice blocks may match each other. For example, as shown in FIG. 8, the splice surfaces of the two adjacent splice block are both sloping surfaces, which may precisely match each other upon being spliced together. In this way, it is able to reduce the gap between the adjacent splice blocks.

Figure 12:
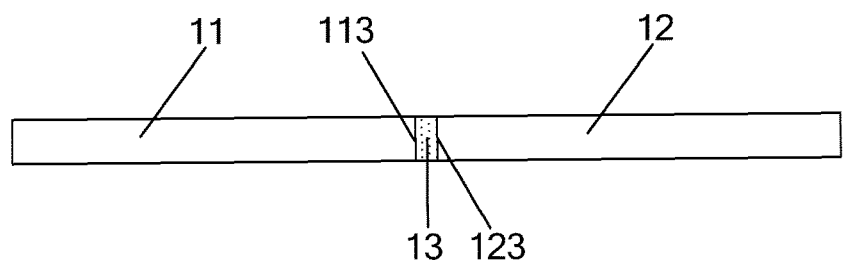
FIG. 12 is a schematic view showing the spliced splice blocks in the packaging substrate according to one embodiment of the present disclosure.

To be specific, the adjacent splice blocks may be concatenated to each other by splicing, e.g., as shown in FIG. 12, a lateral surface 113 of a second splice 11 may be concatenated to a lateral surface 123 of a third splice block 12 by an adhesive material 13.

Figure 13:
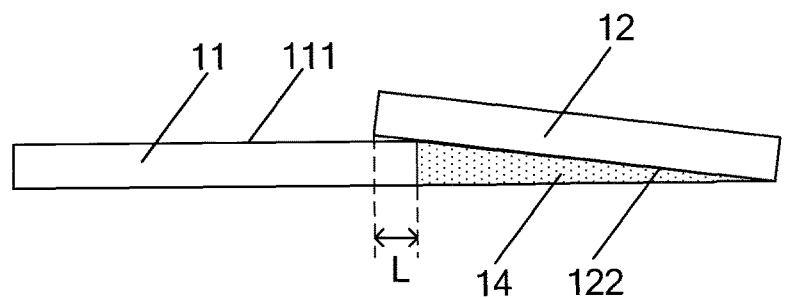
FIG. 13 is a schematic view showing the lapped splice blocks in the packaging substrate according to one embodiment of the present disclosure.

Alternatively, the adjacent splice blocks may be concatenated to each other by lapping, e.g., as shown in FIG. 13, an edge of a lower surface 122 of the third splice block 12 may be lapped onto an edge of an upper surface 111 of the second splicing block 11, and a lapping region (a lapping gap) formed due to the lapping may be filled with the adhesive material, such as a sealant. It should be noted that, the third splice block 12 may be merely lapped onto the second splice block 11 but concatenated to the other splice block by splicing. Of course, the third splice blocks 12 may also be lapped onto the second splice block 11 and the other splice block. Alternatively, all of the splice blocks are concatenated to each other through an identical connection mode, so as to facilitate the manufacture.

It should be further appreciated that, there are advantages and disadvantages for the lapping and splicing modes. To be specific, when the adjacent splice blocks are spliced together, a flat surface may be provided, without any protuberance. When a splice block is lapped onto another splice block, a gap 14 as shown in FIG. 13 may be formed and an adhesive material such as a sealant may be filled into the gap so as to concatenate the splice blocks together in a better manner. However, when one splice block is lapped onto the other, an uneven surface with protuberances may be provided. The connection mode may be selected in accordance with the practical need, which is not particularly defined herein.

Figure 9:
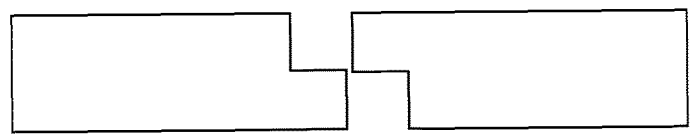
FIG. 9 is a schematic view showing the adjacent splice blocks with stair-like surfaces in the packaging substrate according to one embodiment of the present disclosure.
Figure 10:
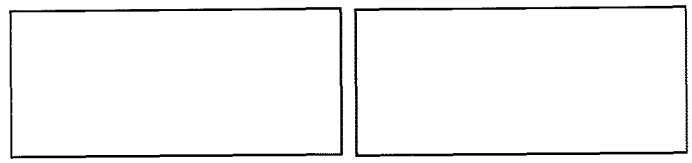
FIG. 10 is a schematic view showing the adjacent splice blocks with upright splice surfaces in the packaging substrate according to one embodiment of the present disclosure.
Figure 11:
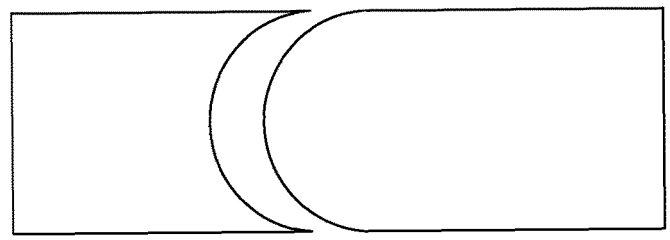
FIG. 11 is a schematic view showing the adjacent splice blocks with arc splice surfaces in the packaging substrate according to one embodiment of the present disclosure.

Alternatively, when the lateral surfaces of the two adjacent splice blocks are concatenated to each other by splicing, the lateral surfaces may be sloping surfaces as shown in FIG. 8, stair-like surfaces as shown in FIG. 9, upright surfaces as shown in FIG. 10, or arc surfaces as shown in FIG. 11. Alternatively, the lateral surfaces of the splice blocks may be upright surfaces, so as to facilitate the manufacture.

Alternatively, one splice block is lapped onto the other splice block at a lapping length of 1 mm to 2 mm, so as to prevent the occurrence of too many protuberances. As shown in FIG. 13, the lapping length L refers to a distance between the lateral surface of the second splice block 11 and a projection of the lateral surface of the third splice block 12 onto the upper surface 111 of the second splice block 11.

Figure 14:
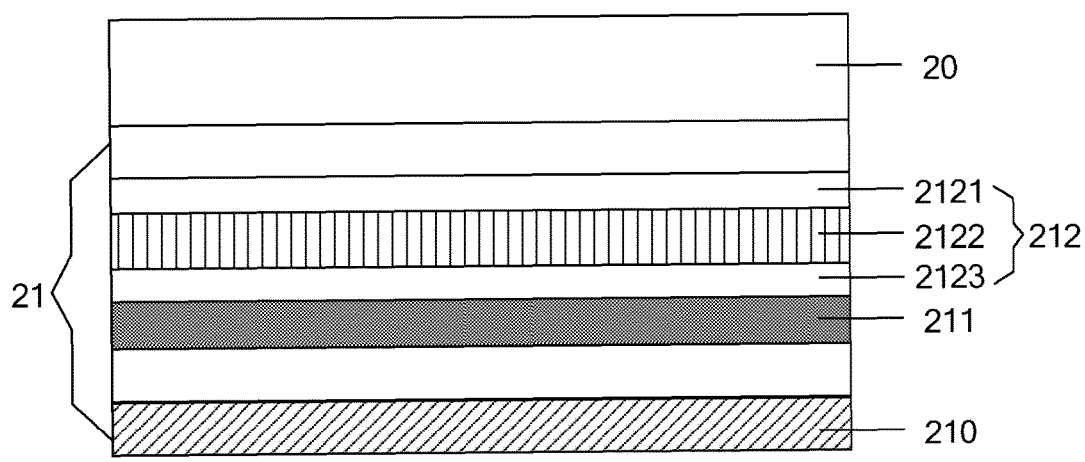
FIG. 14 is a schematic view showing a display panel according to one embodiment of the present disclosure.

The present disclosure further provides in some embodiments a display panel for a curved-surface display device. As shown in FIG. 14, the display panel includes a base substrate 21 and the above-mentioned packaging substrate 20. The base substrate 21 includes a base 210 and an organic light-emitting functional layer 212 formed on the base 210.

It should be appreciated that, the above-mentioned packaging substrate and the base substrate may form together a top-emission display panel or a bottom-emission display panel, which is not particularly defined herein.

It should be further appreciated that, such terms as "upper" and "lower" in the embodiments of the present disclosure refer to orientations or positions on the basis of the drawings, and they are merely used to facilitate the description rather to show any orientation at which a device or element is located, constituted or operated. In other words, such terms shall not be construed as limiting the scope of the present disclosure.

To be specific, when the packaging substrate includes a color filter layer, the base substrate and the packaging substrate may be arranged opposite to each other to form a top-emission display panel. The base substrate may include thin film transistors (TFTs), an organic light-emitting functional layer, etc. For the top-emission display panel, a light beam from the organic light-emitting functional layer is transmitted outwardly through the packaging substrate.

When the base substrate includes the color filter layer, the base substrate may be directly adhered onto the packaging substrate so as to form a bottom-emission display panel. The base substrate may include thin film transistors (TFTs), the color filter layer, an organic light-emitting layer, and etc. For the bottom-emission display panel, a light beam from the organic light-emitting functional layer is transmitted outwardly through the base substrate.

According to the display panel in the embodiments of the present disclosure, it is able to prevent the occurrence of cracks at the packaging substrate when the display panel is bent to form a curved-surface display panel. It should be appreciated that, although the above-mentioned display panel is primarily applied to the curved-surface display device, it may also be applied to any other flat-panel display device, which is not particularly defined herein.

Alternatively, the base substrate and the packaging substrate may be secured to each other by an adhesive material, e.g., a sealant, so as to facilitate the manufacture and reduce the production cost.

Alternatively, as shown in FIG. 14, the base substrate 21 further includes a color filter layer 211 under the organic light-emitting functional layer 212, and the organic light-emitting functional layer 212 includes an electron transport layer 2121, a light-emitting layer 2122 and a hole transport layer 2123. In this way, the base substrate 21 and the packaging substrate 20 may form together a bottom-emission display panel. The packaging substrate includes a plurality of splice blocks and there is a gap between the adjacent splice blocks. When the display panel is the top-emission display panel, a portion of the light beams may come out from the gaps of the packaging substrate, resulting in deterioration of the image quality. Such a drawback may be overcome by the bottom-emission display panel. Thus, it is preferred to form the bottom-emission display panel by the packaging substrate and the base substrate when the packaging substrate includes a plurality of splice blocks. Of course, the base substrate 21 may further include a cathode, an anode, TFTs and etc, which is not particularly defined herein.

The present disclosure further provides in some embodiments a curved-surface display panel formed by bending the above-mentioned display panel. The curved surface of the curved-surface display panel is not prone to be broken, and thus it is able to improve the yield thereof.

Alternatively, in the curved-surface display panel, as shown in FIGS. 1-2, the splice blocks of the packaging substrate are of an identical shape and arranged in at least one row in the direction shown by OM. The splice blocks in each row include a first splice block 10, and the other splice blocks are symmetrically arranged in a row relative to the first splice block 10. Of course, the splice blocks may also be arranged in at least one row in a direction shown by ON. The following description is given by taking the splice blocks arranged in at least one row along the direction shown by OM as an example.

In this way, on one hand, when the splice blocks are of an identical shape, it is able to facilitate the manufacture of the packaging substrate. On the other hand, as shown in FIG. 3, when the external force is applied to the two edges of the packaging substrate, two sides of the packaging substrate may be bent along directions B1B1' and B2B2' respectively. Since the other splice blocks are arranged symmetrically in a row relative to the first splice block 10, the first splicer blocks 10 are located at a top portion of a curved surface of the curved packaging substrate, as to prevent the situation in FIG. 4 where a gap occurs at the top portion of the curved surface and between the adjacent splice blocks. In addition, the deformation energy generated at the top portion of the curved surface of the packaging substrate may be dispersed to the first splice blocks, so as to further enhance the crack resistance at the top portion of the curved surface.

Alternatively, in the curved-surface display panel, as shown in FIGS. 5-6, the packaging substrate includes first splice blocks 10. All the splice blocks are of an identical shape, an odd number of splice blocks are arranged in each row in the direction shown by ON, and the other splice blocks in each row are arranged symmetrically relative to the first block 10. Of course, the other splice blocks may also be arranged in a row in the direction shown by OM. As shown in FIG. 7, when the external force is applied to the two edges of the packaging substrate, two sides of the packaging substrate may be bent along directions of D1D1' and D2D2' respectively. Since the other splice blocks in each row are arranged in a row symmetrically relative to the first splice block 10, the first splice blocks 10 are located at the top portion of the curved surface of the curved packaging substrate, so as to prevent the situation where a gap occurs at the top portion of the curved surface and between the adjacent splice blocks. As a result, it is able to further enhance the crack resistance at the top portion of the curved surface.

The above are merely the preferred embodiments of the present disclosure. It should be noted that, a person skilled in the art may make further improvements and modifications without departing from the principle of the present disclosure, and these improvements and modifications shall also fall within the scope of the present disclosure.

What is claimed is:

1. A packaging substrate, comprising a base having a plurality of splice blocks, wherein adjacent splice blocks are concatenated to each other by an adhesive material, and deformation energy generated at the packaging substrate is dispersed to the plurality of splice blocks concatenated by the adhesive material,
wherein the adjacent splice blocks comprise two adjacent splice blocks, and the two adjacent splice blocks comprise splice surfaces fitting each other,
wherein the two adjacent splice blocks are concatenated to each other by splicing, and a lateral surface of one of the two adjacent splice blocks is concatenated to a lateral surface of the other one of the two adjacent splice blocks; or the two adjacent splice blocks are concatenated to each other by overlapping, and an edge of a lower surface of one of the two adjacent splice blocks is lapped onto an edge of an upper surface of the other one of the two adjacent splice blocks,
wherein each splice block is lapped onto one adjacent splice block, and concatenated to another adjacent splice block by splicing.

2. The packaging substrate according to claim 1, wherein each splice block is made of glass or a metal foil.

3. The packaging substrate according to claim 2, wherein the glass has a thickness of less than or equal to 500 μm.

4. The packaging substrate according to claim 3, wherein the glass has a thickness of less than or equal to 50 μm.

5. The packaging substrate according to claim 3, wherein the splice blocks are of an identical shape and arranged in at least one row, the splice blocks in each row comprises a first splice block, and other splice blocks in each row are arranged symmetrically relative to the first splice block.

6. The packaging substrate according to claim 1, wherein lateral surfaces of the splice blocks are vertical surfaces, stair-shaped surfaces or arc surfaces.

7. The packaging substrate according to claim 1, wherein one of the two adjacent splice blocks is lapped onto the other one of the two adjacent splice blocks at a lapping length of 1 mm to 2 mm, and the lapping length refers to a distance between a lateral surface of the other one of the two adjacent splice blocks and a projection of a lateral surface of the one of the two adjacent splice blocks onto an upper surface of the other one of the two adjacent splice blocks.

8. A display panel, comprising:
a base substrate comprising an organic light-emitting functional layer; and
a packaging substrate, comprising a base having a plurality of splice blocks, wherein adjacent splice blocks are concatenated to each other by an adhesive material, and deformation energy generated at the packaging substrate is dispersed to the plurality of splice blocks concatenated by the adhesive material,
wherein the base substrate and the packaging substrate are concatenated to each other by an adhesive material.

9. The display panel according to claim 8, wherein the adhesive material is a sealant.

10. The display panel according to claim 8, wherein the base substrate further comprises a color filter layer under the organic light-emitting functional layer.

11. The display panel according to claim 8, wherein the organic light-emitting functional layer comprises an electron transport layer, a light-emitting layer and a hole transport layer.

12. A curved-surface display panel formed by bending the display panel according to claim 8.

13. The curved-surface display panel according to claim 12, wherein the splice blocks of the packaging substrate are of an identical shape and arranged in at least one row, the splice blocks in each row comprise a first splice block, other splice blocks in each row are arranged symmetrically relative to the first splice block, and the first splice blocks are located at a top portion of a curved surface of the curved-surface display panel.

14. The curved-surface display panel according to claim 12, wherein the splice blocks of the packaging substrate are of an identical shape, the packaging substrate comprises a first splice block, and other splice blocks are arranged in a row symmetrically relative to the first splice block.

15. The display panel according to claim 8, wherein each splice block is made of glass or a metal foil.

16. The display panel according to claim 15, wherein the glass has a thickness of less than or equal to 500 μm.

17. The display panel according to claim 16, wherein the glass has a thickness of less than or equal to 50 μm.

18. The display panel according to claim 16, wherein the splice blocks are of an identical shape and arranged in at least one row, the splice blocks in each row comprises a first splice block, and other splice blocks in each row are arranged symmetrically relative to the first splice block.

19. The display panel according to claim 8, wherein
the adjacent splice blocks comprise two adjacent splice blocks, and the two adjacent splice blocks comprise splice surfaces fitting each other,
the two adjacent splice blocks are concatenated to each other by splicing, and a lateral surface of one of the two adjacent splice blocks is concatenated to a lateral surface of the other one of the two adjacent splice blocks; or the two adjacent splice blocks are concatenated to each other by overlapping, and an edge of a lower surface of one of the two adjacent splice blocks is lapped onto an edge of an upper surface of the other one of the two adjacent splice blocks,
each splice block is lapped onto one adjacent splice block, and concatenated to another adjacent splice block by splicing.

20. The packaging substrate according to claim 19, wherein lateral surfaces of the splice blocks are vertical surfaces, stair-shaped surfaces or arc surfaces.

* * * * *